United States Patent
Lee et al.

(10) Patent No.: US 10,444,284 B2
(45) Date of Patent: Oct. 15, 2019

(54) DIAGNOSTIC APPARATUS FOR SWITCHGEAR

(71) Applicant: LSIS CO., LTD., Anyang-si, Gyeonggi-do (KR)

(72) Inventors: Jinho Lee, Anyang-si (KR); Hyunho Kwon, Anyang-si (KR); Changhwan Jin, Anyang-si (KR)

(73) Assignee: LSIS CO., LTD., Anyang-si, Gyeonggi-Do (KR)

( * ) Notice: Subject to any disclaimer, the term of this patent is extended or adjusted under 35 U.S.C. 154(b) by 88 days.

(21) Appl. No.: 15/850,906

(22) Filed: Dec. 21, 2017

(65) Prior Publication Data

US 2018/0180677 A1 Jun. 28, 2018

(30) Foreign Application Priority Data

Dec. 22, 2016 (KR) .................... 10-2016-0177029

(51) Int. Cl.
*G01R 31/327* (2006.01)
*G01R 31/12* (2006.01)

(52) U.S. Cl.
CPC ......... *G01R 31/3275* (2013.01); *G01R 31/12* (2013.01); *G01R 31/129* (2013.01); *G01R 31/3277* (2013.01)

(58) Field of Classification Search
CPC .. G01R 31/3275; G01R 31/12; G01R 31/129; G01R 31/3277

(Continued)

(56) References Cited

U.S. PATENT DOCUMENTS

2012/0143533 A1  6/2012  Luna et al.
2013/0113659 A1* 5/2013  Morgan ............ G01R 29/0871
                                          342/443

(Continued)

FOREIGN PATENT DOCUMENTS

EP    2324364 B1    7/2009
JP    2008145301 A  6/2008

(Continued)

OTHER PUBLICATIONS

Korean Office Action for related Korean Application No. 10-2016-0177029; action dated Jul. 31, 2017; (7 pages).

(Continued)

*Primary Examiner* — Melissa J Koval
*Assistant Examiner* — Trung Nguyen
(74) *Attorney, Agent, or Firm* — K&L Gates LLP

(57) ABSTRACT

The invention relates to reliable diagnostic apparatus for a switchgear which may minimize the probability of failure in diagnosing a deterioration of a switchgear. The diagnostic apparatus for a switchgear comprises a VHF sensor detecting an electromagnetic wave signal of a VHF band, which is generated by the switchgear; a UHF sensor detecting an electromagnetic wave signal of a UHF band, which is generated by the switchgear; a data acquisition unit that acquires the electromagnetic wave signals detected by the VHF sensor and the UHF sensor, and converts the electromagnetic wave signals into data indicating magnitudes of the electromagnetic wave signals; and a diagnosis unit connected with the data acquisition unit and that executes analysis including whether the data provided by the data acquisition unit is a pattern of a partial discharge signal and stores the analyzed result.

7 Claims, 7 Drawing Sheets

(58) Field of Classification Search
USPC ...... 324/200, 207.14–207.18, 219–225, 239,
324/241, 637, 639, 600, 500, 529, 530,
324/764.01, 134
See application file for complete search history.

(56) References Cited

U.S. PATENT DOCUMENTS

2013/0179100 A1  7/2013  Guo
2015/0120218 A1  4/2015  Garnacho Vecino et al.

FOREIGN PATENT DOCUMENTS

| | | |
|---|---|---|
| JP | 2014169978 A | 9/2014 |
| JP | 2014224743 A | 12/2014 |
| KR | 10-0595462 B1 | 6/2006 |
| KR | 1020090102032 A | 9/2009 |
| KR | 1020100044425 A | 4/2010 |
| KR | 1020130047418 A | 8/2013 |
| KR | 20140004398 A | 1/2014 |
| KR | 10-1402887 B1 | 6/2014 |
| KR | 1020140114380 | 8/2014 |
| KR | 1020150089271 A | 5/2015 |
| KR | 101553005 B1 | 10/2015 |

OTHER PUBLICATIONS

Korean Office Action for related Korean Application No. 10-2016-0177029; action dated Mar. 29, 2018; (6 pages).

\* cited by examiner

DIAGNOSTIC APPARATUS FOR SWITCHGEAR

CROSS-REFERENCE TO RELATED APPLICATION

Pursuant to 35 U.S.C. § 119(a), this application claims the benefit of earlier filing date and right of priority to Korean Application No. 10-2016-0177029, filed on Dec. 22, 2016, the contents of which is incorporated by reference herein in its entirety.

BACKGROUND OF THE INVENTION

1. Field of the Invention

The present invention relates to a diagnostic apparatus for a switchgear, and more particularly, to a diagnostic apparatus that may diagnose integrity of a switchgear of a power distribution level via on-line.

2. Description of the Conventional Art

The present invention relates to a diagnostic technology of a switchgear, which may determine integrity of a switchgear prior to an electric power accident by detecting a partial discharge signal of an Ultra High Frequency (UHF) or Very High Frequency (VHF) band, which is generated when an electric gear (a switchgear) of an electric power distribution stage is deteriorate, and analyzing the detected partial discharge signal.

An example of the diagnostic apparatus for a switchgear according to the conventional art will be described with reference to FIG. 1.

Referring to FIG. 1, the diagnostic apparatus for a switchgear according to the conventional art includes a partial discharge sensor 10, a data acquisition unit (DAU) 20, and a human machine interface (HMI) device 30.

The partial discharge sensor 10 may be comprised with a UHF partial discharge sensor for detecting partial discharge of a UHF band or a VHF partial discharge sensor for detecting partial discharge of a VHF band.

The UHF band may herein mean a frequency band of 300 MHz to 800 MHz, and the VHF band may herein mean a frequency band of 500 KHz to 150 MHz.

The UHF partial discharge sensor may be configured with a spiral sensor, as disclosed in the following patent reference given to the applicant of the present invention.

(Patent Reference 1) KR10-0595462 B1

The UHF partial discharge sensor can detect and provide a partial discharge signal generated as a radio electromagnetic wave signal of a frequency band of 300 MHz to 800 MHz.

The VHF partial discharge sensor may be configured with a Transient Earth Voltage (TEV) sensor or a Current Transformer (CT) sensor, which detects a partial discharge signal flowing to a ground side of an electric power equipment (for example, a switchgear).

The partial discharge sensor 10 detects a partial discharge signal and transmits the detected signal as an analog signal to the data acquisition unit 20.

The data acquisition unit 20 converts the partial discharge signal received from the partial discharge sensor 10 into a voltage signal of mV unit or a receiving strength signal of dBm unit and transmits the converted signal to the HMI device 30.

In this case, the data acquisition unit 20 includes either a UHF module or a VHF module. If the data acquisition unit 20 includes the VHF module, the data acquisition unit 20 can convert and process only the partial discharge signal of the VHF band. If the data acquisition unit 20 includes the UHF module, the data acquisition unit 20 can convert and process only the partial discharge signal of the UHF band.

Since the HMI device 30 includes a diagnostic program (diagnostic software) built therein, the HMI device 30 determines whether the partial discharge signal transmitted from the data acquisition unit 20 is a partial discharge signal or a noise signal on the basis of data of the partial discharge signal. The determined result of the HMI interface 30 can be output to be checked by a user through a display included in the HMI device 30 in the form of a percentage (%) value and graph (chart).

The occurrence of the partial discharge signal in the electric power equipment such as switchgear of the power distribution stage may occur in both or any one of the VHF band and the VHF band in accordance with a defect of the electric power equipment, deterioration of the electric power equipment and environment conditions (for example, temperature and humidity).

However, since the above-described diagnostic apparatus for a switchgear according to the conventional art is configured to acquire only the partial discharge signal of the VHF band or the partial discharge signal of the UHF band in the detecting step and the data acquisition step, the partial discharge signal of any one of the VHF band and the UHF band may not be acquired, whereby there may be a risk in that the deterioration of electric power facilities cannot be diagnosed in advance.

SUMMARY OF THE INVENTION

Therefore, the present invention is to solve the aforementioned problems of the diagnostic apparatus for a switchgear according to the conventional art. An object of the present disclosure is to provide a reliable diagnostic apparatus for a switchgear, which may minimize the probability of failure in diagnosing the deterioration of power facilities by acquiring and analyzing a partial discharge signal of a VHF band and a partial discharge signal of a UHF band.

To achieve these and other objects and in accordance with the purpose of the present disclosure, as embodied and broadly described herein, a diagnostic apparatus for a switchgear according to the present disclosure comprising: a Very High Frequency (VHF) sensor that detects an electromagnetic wave signal of a VHF band, which is generated by the switchgear of a diagnosis target; an Ultra High Frequency (UHF) sensor that detects an electromagnetic wave signal of a UHF band, which is generated by the switchgear of the diagnosis target; a data acquisition unit that acquires the electromagnetic wave signals detected by the VHF sensor and the UHF sensor, and converts the electromagnetic wave signals into data indicating magnitudes of the electromagnetic wave signals; and a diagnosis unit connected with the data acquisition unit by communication and that executes analysis including whether the data provided by the data acquisition unit is a pattern of a partial discharge signal and stores the analyzed result.

According to one aspect of the present disclosure, the data acquisition unit is configured to execute a phase synchronization process for phase-synchronizing the electromagnetic wave signals with a normal electric power signal, and the diagnosis unit is configured to determine a type of a partial discharge cause in accordance with similarity of the pattern of the partial discharge signal with respect to distribution characteristic for each type of the partial discharge cause on the basis of the distribution characteristic of data of the partial discharge signal, which is concentrated on a specific phase angle, and determine whether the electromagnetic wave signals are the pattern of the partial discharge signal.

According to another aspect of the present disclosure, the diagnosis unit is configured to check whether a magnitude of the electromagnetic wave signal is a predetermined reference value or more for a predetermined time period and a trend of occurrence times of the predetermined reference value or more when the pattern represented by the data provided from the data acquisition unit is not a pattern of the partial discharge signal.

According to still another aspect of the present disclosure, the diagnosis unit is configured to determine whether the electromagnetic wave signal is generated in the UHF band only, both the UHF band and the VHF band, or the VHF band only.

According to still another aspect of the present disclosure, the diagnosis unit is configured to determine whether the probability that the pattern of the electromagnetic wave signal is the partial discharge signal pattern of the VHF band is higher than the predetermined reference value on the basis of the analyzed result.

According to still another aspect of the present disclosure, the diagnosis unit is configured to determine whether the probability that the pattern of the electromagnetic wave signal is the partial discharge pattern of the UHF band is higher than the predetermined reference value when the probability that the pattern of the electromagnetic wave signal is the partial discharge pattern of the VHF band is not lower than the predetermined reference value.

According to still another aspect of the present disclosure, if the type of the partial discharge cause is determined, the diagnosis unit is configured to add a weight value to the probability of the determined type of partial discharge.

According to still another aspect of the present disclosure, the diagnostic apparatus for a switchgear further comprising: a temperature sensor that detects a temperature of the switchgear of the diagnosis target; and a humidity sensor that detects humidity of the switchgear of the diagnosis target, wherein the data acquisition unit is configured to provide temperature data and humidity data detected by the temperature sensor and the humidity sensor to the diagnosis unit, and the diagnosis unit is configured to diagnose the partial discharge caused by temperature and humidity increase, diagnose the partial discharge caused by temperature increase, diagnose the partial discharge caused by humidity increase, or diagnose the partial discharge caused by a cause irrespective of temperature and humidity, on the basis of an increasing trend of temperature, humidity and occurrence times of the partial discharge signal for a time period which is preset.

BRIEF DESCRIPTION OF THE DRAWINGS

The accompanying drawings, which are included to provide a further understanding of the invention and are incorporated in and constitute a part of this specification, illustrate exemplary embodiments and together with the description serve to explain the principles of the invention.

In the drawings.

DETAILED DESCRIPTION OF THE INVENTION

The objects, features and advantages of the present invention will be clarified through following description of the preferred embodiments described with reference to the accompanying drawings.

Figure 1:
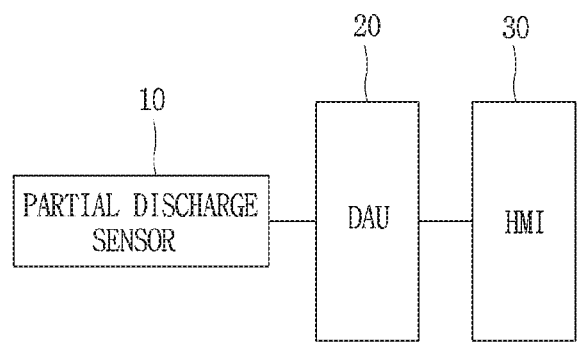
FIG. 1 is a block diagram illustrating a diagnostic apparatus for a switchgear according to the conventional art.
Figure 2:
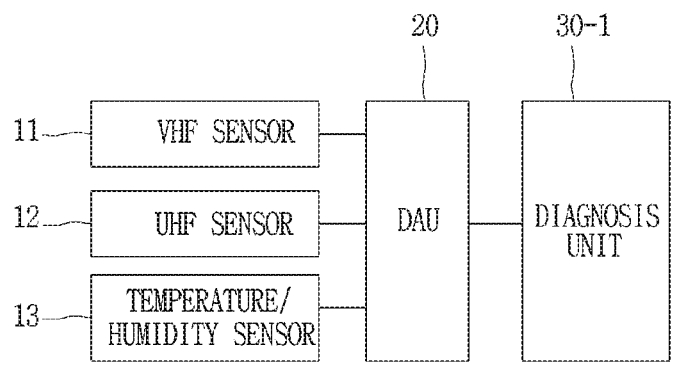
FIG. 2 is a block diagram illustrating a diagnostic apparatus for a switchgear according to one preferred embodiment of the present invention.

A diagnostic apparatus for an electric equipment according to one preferred embodiment of the present invention comprises a VHF sensor 11, a UHF sensor 12, temperature and humidity sensors 13, a data acquisition unit 20, and a diagnosis unit 30-1, as seen with reference to FIG. 2.

The VHF sensor 11 is a sensor for detecting a partial discharge signal of a VHF band (frequency band of 500 KHz to 150 MHz in accordance with embodiment) generated by a switchgear of a diagnosis target.

Figure 3:
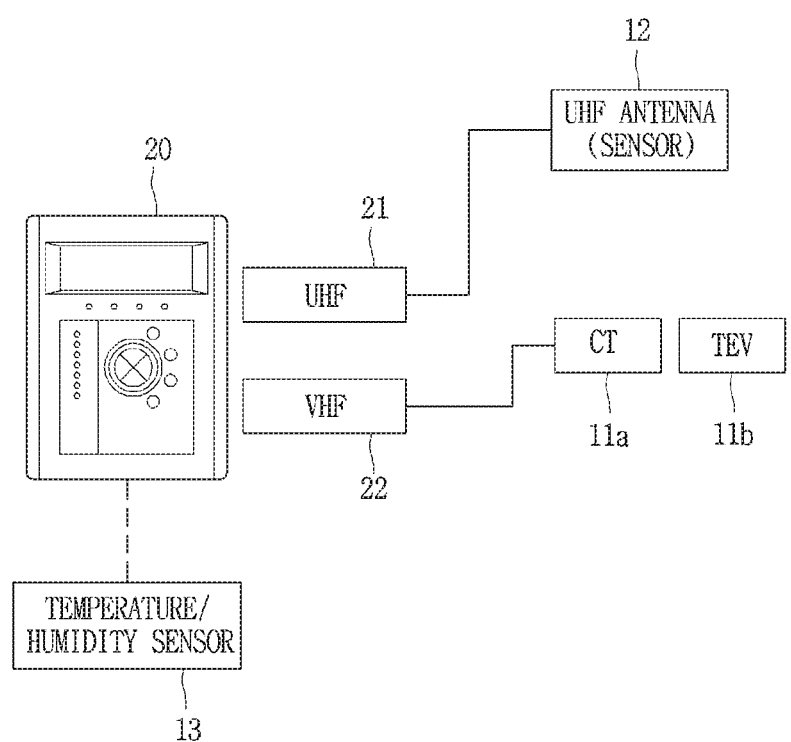
FIG. 3 is a block diagram illustrating a configuration of a data acquisition unit and sensors of FIG. 2.

The VHF sensor 11 may be configured with a current transformer (CT) 11a or a transient earth voltage (TEV) sensor 11b as shown in FIG. 3 in accordance with the embodiment.

The electric gear may be a switchgear, for example, and the VHF sensor 11 is installed in a ground line (an earthing line) inside the switchgear, and detects a partial discharge signal of a VHF band, which may be leaked out through the ground line.

The UHF sensor 12 is a sensor for detecting a partial discharge signal of a UHF band (frequency band of 300 MHz to 800 MHz in accordance with embodiment) generated by the electric gear of a diagnosis target, such as a switchgear.

The UHF sensor 12 can be configured with a UHF antenna, and can be configured with a spiral sensor (spiral antenna) or a patch type sensor (patch antenna) in accordance with the embodiment.

The temperature sensor of the temperature and humidity sensors 13 is installed in the electric gear of the diagnosis target (for example, installed on an inner wall of the switchgear), and detects a temperature of the electric gear.

The temperature sensor is connected to the data acquisition unit 20 and provides a temperature detection signal according to the temperature of the electric gear to the data acquisition unit 20.

The humidity sensor of the temperature and humidity sensors 13 is installed in the electric gear of the diagnosis target (for example, installed on an inner wall of the switchgear), and detects humidity of the electric gear.

The humidity sensor is connected to the data acquisition unit 20 and provides a humidity detection signal according to the humidity of the electric gear to the data acquisition unit 20.

The data acquisition unit 20 acquires both of electromagnetic wave signals detected by the VHF sensor 11 and the UHF sensor 12, performs a phase synchronization process for synchronizing a phase with a normal power signal {for example, sine wave signal of 60 Hz, see sine waveform signal (the normal power signal) of FIGS. 7 to 10}, converts the processed signal to data indicating a magnitude of the electromagnetic wave signal including voltage, and provides (outputs) the converted data.

In this case, the data indicating the magnitude of the electromagnetic wave signal may be data indicating at least one of voltage of the electromagnetic wave signal of mV unit, signal strength of the electromagnetic wave signal of dBm unit, charge amount of the electromagnetic wave signal of pC unit.

Also, the data acquisition unit 20 receives the temperature detection signal and the humidity detection signal provided by the temperature and humidity sensors 13, converts the received signals to data indicating temperature and humidity of the electric gear of the diagnosis target by analog-digital converting, and provides (outputs) the converted data.

The data acquisition unit 20 may provide output data to the diagnosis unit 30-1 together with an identification data to identify whether the output data is data indicating a VHF band signal received from the VHF sensor 11 or a UHF band signal received from the UHF sensor 12.

The data acquisition unit 20 includes a VHF RF module 22 which is a circuit section for receiving the electromagnetic wave signal of the VHF band from the VHF sensor 11, and a UHF RF module 21 which is a circuit section for receiving the electromagnetic wave signal of the UHF band from the UHF sensor 12.

The data acquisition unit 20 includes a phase synchronization circuit section, an analog-to-digital converting circuit, and a communication circuit section.

The phase synchronization circuit section synchronizes a phase of the electromagnetic wave signal with a normal alternating current power signal (for example, sine wave signal of 60 Hz, see the normal power signal of FIGS. 7 to 10).

The analog-to-digital converting circuit section converts the received (acquired) analog signal type electromagnetic wave signal to a digital signal indicating the magnitude, and converts the temperature detection signal and the humidity detection signal to digital signals, thereby outputting the converted signals.

The communication circuit section transmits data of the received electromagnetic wave signal and the data according to the received detection temperature and the detection humidity to the diagnosis unit 30-1.

Also, the data acquisition unit 20 may include a microcomputer or microprocessor as a computerizing and processing circuit section for determining whether partial discharge is generated in accordance with a processing program stored based on the received (acquired) partial discharge signal and displaying the determined result, and a display section (for example, liquid crystal display and light emitting diode).

The diagnosis unit 30-1 is connected to the data acquisition unit 20 by communication, determines whether the data provided by the data acquisition unit 20 is a pattern of the partial discharge signal or not, executes analysis for determining a cause of partial discharge per type, and stores the analyzed result.

The diagnosis unit 30-1 can be configured with a computer means that executes analysis in accordance with an analysis processing program built therein, stores the analyzed result, and displays the analyzed result to a user. The analyzed result can be displayed by the diagnosis unit 30-1 as magnitude data of the partial discharge signal, that is, a maximum value, a minimum value, an average value of at least one of voltage value (mV), signal strength (dBm) value, and charge amount (pC), data of occurrence times, data of probability percentage per partial discharge cause and defect type (protrusion, void, floating, surface electric leakage), graphic data of three-dimension, two-dimension or chart of magnitude data, as a trend chart of these data, in such a manner that the chart is displayed one by one on one screen or a plurality of charts are displayed on one screen by split through the display section included in the diagnosis unit 30-1.

Also, the analyzed result may be displayed on one screen as a "partial discharge diagnosis report" through the display section together with a serial number of the corresponding electric gear (switchgear), a serial number of the related data acquisition unit 20, a sensor install position indicating diagram, and a message related to estimation cause and corrective measure as well as the above data, or may be output through an output means such as a printer connected to the diagnosis unit 30-1 and suggested to a user.

Therefore, the diagnosis unit 30-1 can be configured with a personal computer, a notebook computer, and a pad type computer, each of which includes an HMI section, a communication section, a computerizing and processing section, a memory, and a display section.

Figure 4:
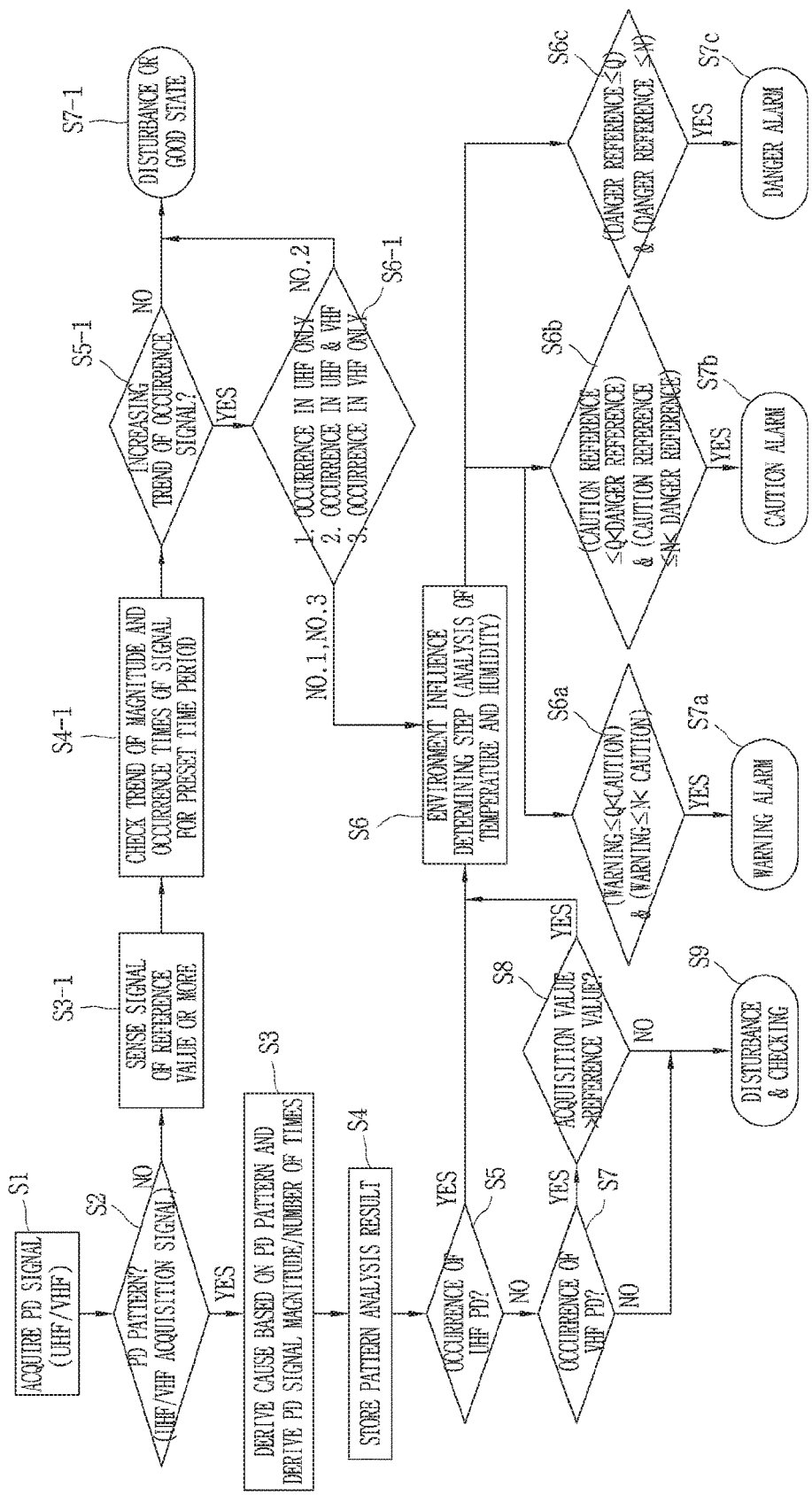
FIG. 4 is a flow chart illustrating a diagnosing method performed by a diagnosis unit or a diagnostic operation of the diagnosis unit in a diagnostic apparatus for a switchgear according to one preferred embodiment of the present invention.

As seen with reference to steps S2 to S4 of FIG. 4, the diagnosis unit 30-1 is configured to execute the analysis and store the analyzed result when the data provided by the data acquisition unit 20 is a pattern of the partial discharge signal.

As seen with reference to steps S3-1 and S4-1 of FIG. 4, the diagnosis unit 30-1 is configured to check whether a magnitude of the partial discharge signal is a predetermined reference value or more and a trend of occurrence times of the partial discharge signal when the data provided by the data acquisition unit 20 is not a pattern of the partial discharge signal.

As seen with reference to step S6-1 of FIG. 4, when occurrence times is in an increasing trend, the diagnosis unit 30-1 is configured to determine whether the acquired electromagnetic wave signal is generated in the UHF band only, both of the UHF band and the VHF band, or the VHF band only.

Figure 5:
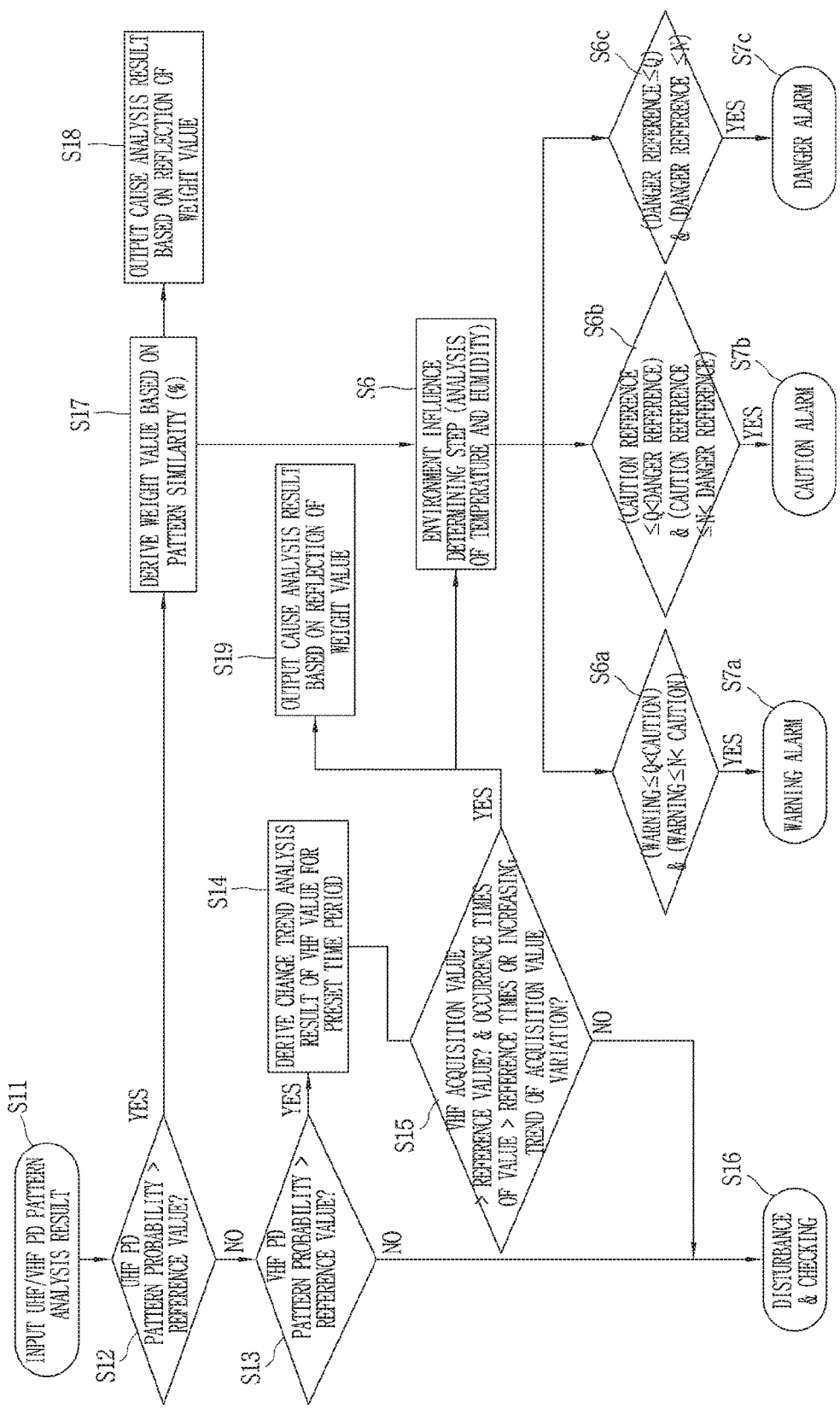
FIG. 5 is a flow chart illustrating a diagnosing method performed by a diagnosis unit or a diagnostic operation of the diagnosis unit in a diagnostic apparatus for a switchgear according to one preferred embodiment of the present invention, especially a detailed flow chart illustrating a procedure of analyzing and outputting a partial discharge cause on the basis of a partial discharge analysis result and processing effect analysis of temperature and humidity and alarm.

As seen with reference to step S12 of FIG. 5, the diagnosis unit 30-1 is configured to determine whether the probability that a pattern of the partial discharge signal is a partial discharge pattern of the VHF band is higher than a predetermined reference value on the basis of the analyzed result.

As seen with reference to step S13 of FIG. 5, the diagnosis unit 30-1 is configured to determine whether the probability that the pattern of the partial discharge signal is a partial discharge pattern of the UHF band is higher than a predetermined reference value when the probability that the pattern of the partial discharge signal is the partial discharge pattern of the VHF band is lower than the predetermined reference value.

Figure 6:
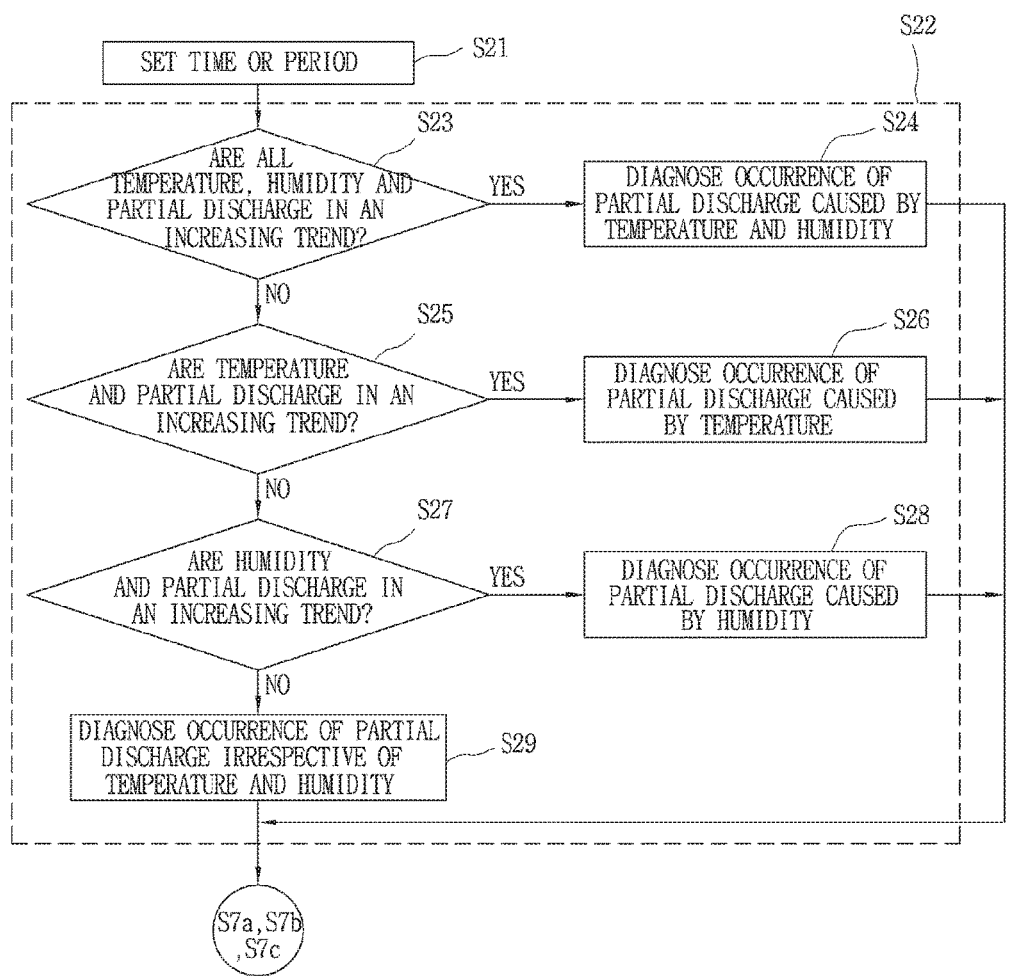
FIG. 6 is a flow chart illustrating a diagnosing method performed by a diagnosis unit or a diagnostic operation of the diagnosis unit in a diagnostic apparatus for a switchgear according to one preferred embodiment of the present invention, especially a flow chart illustrating a procedure of analyzing effect of temperature and humidity.

Meanwhile, an operation of the diagnostic apparatus for a switchgear according to the preferred embodiment of the present invention described with reference to FIGS. 4 to 6 mainly and FIGS. 2, 3 and 7 to 10 subsidiarily, especially an operation of the diagnosis unit 30-1 will be described as follows.

First of all, the operation of the diagnosis unit 30-1 will be described with reference to FIG. 4.

In step S1, the diagnosis unit 30-1 acquires (receives) data provided by the data acquisition unit 200. The acquired (received) data include both data according to the electromagnetic wave signal of the UHF band, which is detected by the UHF sensor 12, and data according to the electromagnetic wave signal of the VHF band, which is detected by the VHF sensor 11.

In step S2, the diagnosis unit 30-1 determines whether a pattern indicated by corresponding data is a pattern of the partial discharge signal on the basis of the data acquired (received) from the data acquisition unit 20.

The operation of the step S2 will be described in more detail.

Figure 7:
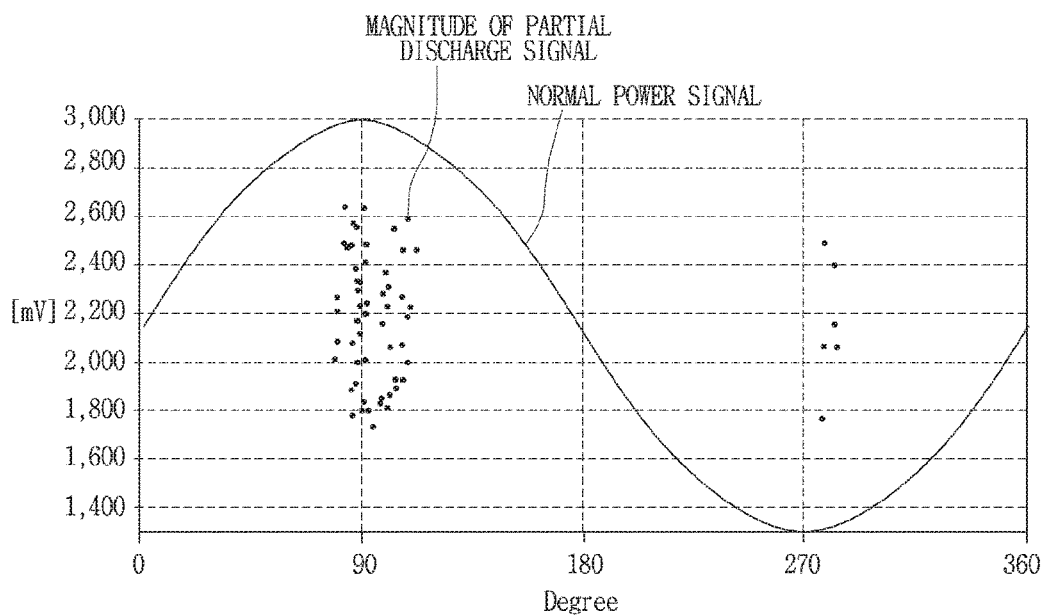
FIG. 7 is a detection signal characteristic view displayed in a diagnosis unit in a diagnostic apparatus for a switchgear according to one preferred embodiment of the present invention, especially a signal pattern characteristic view illustrating a partial discharge signal pattern characteristic generated by a protrusion cause.

Since the data acquisition unit 20 synchronizes the electromagnetic wave signals detected by the UHF sensor 12 and the VHF sensor 11 with a normal electric power signal (for example, sine wave voltage signal of 60 Hz, see the normal power signal of FIG. 7) and provides the synchronized signals, the data received by the diagnosis unit 30-1 may be displayed like distribution of received data compared with a phase angle of 0° to 360° of the sine wave signal with reference to FIGS. 7 to 10.

The diagnosis unit 30-1 can determine the pattern of the partial discharge signal by classifying distribution characteristic of the received data in accordance with the analysis processing program.

Partial discharge can be classified into four kinds of causes in accordance with occurrence causes.

First of all, data of the partial discharge signal generated by a cause called protrusion (in other words "corona") represents a pattern characteristic concentrated on each of phase angles of about 90° and 270° as seen with reference to FIG. 7.

The partial discharge caused by the protrusion cause (protrusion defect) is mainly generated in a cable of a poor insulation state, an air gap generated among tight cables, and a protruded conductor.

Figure 8:
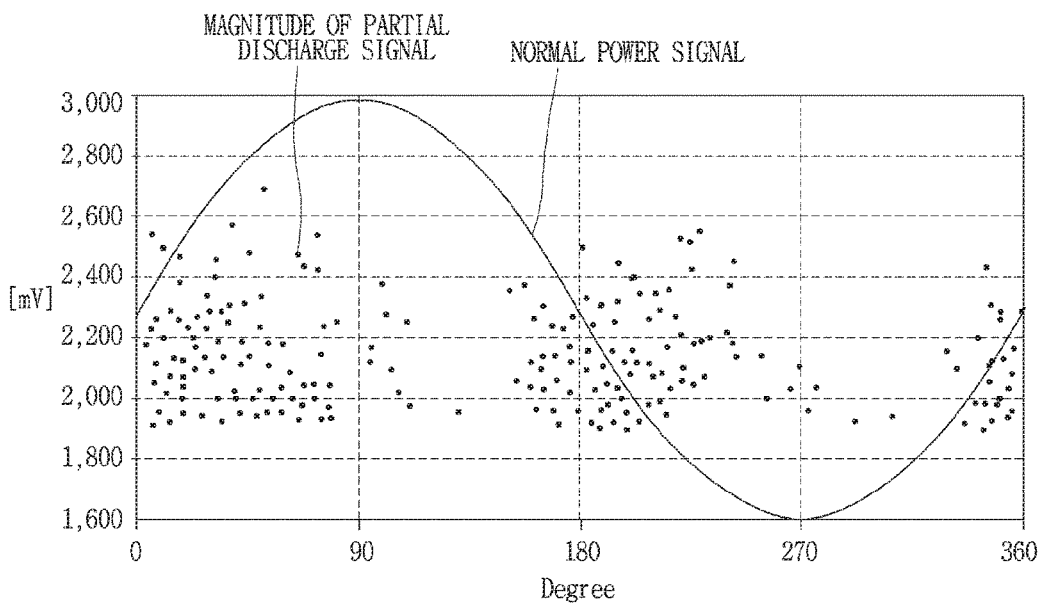
FIG. 8 is a pattern characteristic view of a detection signal displayed in a diagnosis unit in a diagnostic apparatus for a switchgear according to one preferred embodiment of the present invention, especially a signal pattern characteristic view illustrating a partial discharge signal pattern characteristic generated by a void cause.

Secondly, data of the partial discharge signal generated by a cause called void represents a pattern characteristic concentrated on each of phase angles of about 0° to 70°, 175° to 230° and 360° as seen with reference to FIG. 8.

The partial discharge caused by the void cause (void defect) is mainly generated in an air gap between a bus bar and an insulator, an air gap between the bus bar and a barrier, inner defect of an insulator for a current transformer, and a cable insulating section.

Figure 9:
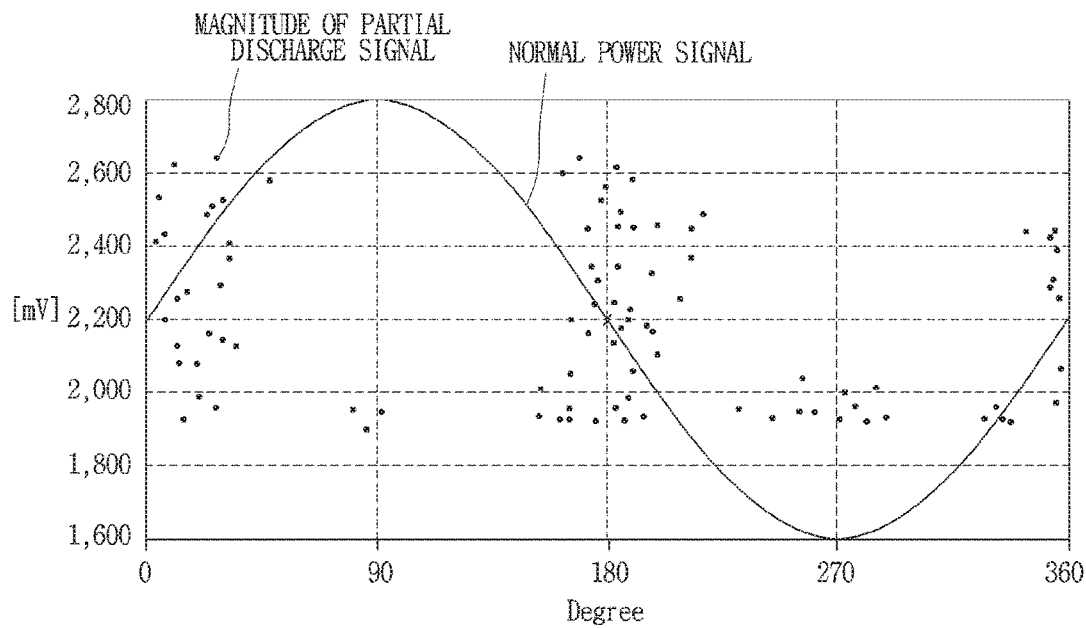
FIG. 9 is a pattern characteristic view of a detection signal displayed in a diagnosis unit in a diagnostic apparatus for a switchgear according to one preferred embodiment of the present invention, especially a signal characteristic view illustrating a partial discharge signal pattern characteristic generated by a floating cause.

Thirdly, data of the partial discharge signal generated by a cause called floating represents a pattern characteristic concentrated on the periphery of each of phase angles of 15° to 40°, 60° to 70°, 200° to 210° and 250° as seen with reference to FIG. 9.

The partial discharge caused by the floating cause (floating defect) is mainly generated in a bolt release, a floating state debris caused by carelessness of worker, a conductor debris inside the current transformer or bus bar insulator, and a conductor of a non-ground state.

Figure 10:
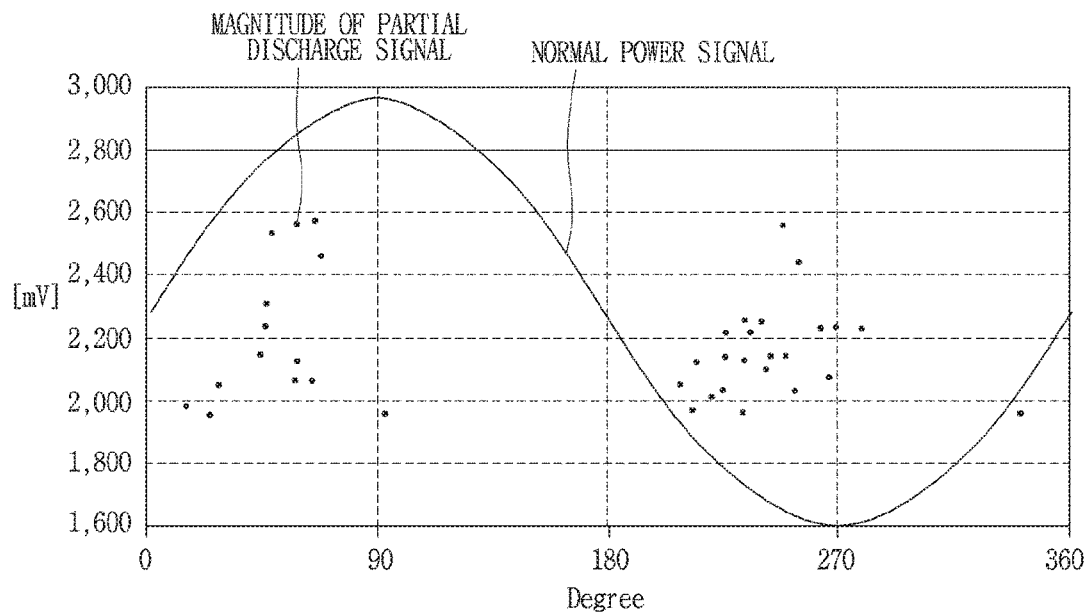
FIG. 10 is a pattern characteristic view of a detection signal displayed in a diagnosis unit in a diagnostic apparatus for a switchgear according to one preferred embodiment of the present invention, especially a signal pattern characteristic view illustrating a partial discharge signal pattern characteristic generated by a surface electric leakage.

Fourthly, data of the partial discharge signal generated by a cause called surface electric leakage represents a pattern characteristic concentrated on each of phase angles of about 10° to 80° and 190° to 270° as seen with reference to FIG. 10.

The partial discharge caused by the surface electric leakage cause (defect) is mainly generated in a damaged or aged insulator (insulator, barrier).

Therefore, the diagnosis unit 30-1 can determine that the received data is a pattern of partial discharge in accordance with the analysis processing program when a distribution characteristic of the received data is similar to a pattern characteristic for each of the above-described four causes.

For reference, the pattern characteristic of the received data by means of normal noise compared with the partial discharge signal is uniformly generated for all phase angles of 0° to 360°.

In step S3, the diagnosis unit 30-1 derives a cause of partial discharge as a partial discharge pattern of a corresponding cause when the cause of partial discharge is similar to any one of pattern characteristics for the above-described four causes on the basis of the data acquired (received) from the data acquisition unit 20, stores a data value (magnitude data of the electromagnetic wave signal), and counts occurrence times.

In step S4, the diagnosis unit 30-1 stores the cause of the partial discharge, the data value and occurrence times, which are derived in step S3, in the memory (memory means) such as a flash memory and hard disc, which are not shown, as a result of analysis of the partial discharge pattern.

In step S5, the diagnosis unit 30-1 determines whether partial discharge of the UHF band occurs on the basis of the identification data provided by the data acquisition unit 20.

For example, if the identification data provided by the data acquisition unit 20 indicates a signal of the UHF band and a pattern indicated by the acquired data is similar to any one of pattern characteristics for the above-described four causes, the diagnosis unit 30-1 can determine that UHF partial discharge occurs in the electric gear.

If it is determined that UHF partial discharge occurs in step S5, the diagnosis unit 30-1 analyzes environment influence of temperature and humidity by advancing to step S6.

The process of analyzing environment influence of temperature and humidity will be described in detail with reference to FIG. 6. First of all, the operation of the diagnosis unit 30-1 when it is determined that UHF partial discharge does not occur in step S5 will be described.

When it is determined that UHF partial discharge does not occur in step S5, the diagnosis unit 30-1 determines whether partial discharge of the VHF band occurs on the basis of the identification data provided by the data acquisition unit 20 in step S7.

For example, if the identification data provided by the data acquisition unit 20 indicates a signal of the VHF band and a pattern indicated by the acquired data is similar to any one of pattern characteristics for the above-described four causes, the diagnosis unit 30-1 may determine that VHF partial discharge occurs in the electric gear.

If it is determined that VHF partial discharge occurs in the electric gear in step S7, the diagnosis unit 30-1 advances to step S8.

In step S8, the diagnosis unit 30-1 determines whether a value of the data transmitted from the data acquisition unit 20 is greater than a predetermined reference value.

In this case, the value of the acquired data may be configured with at least any one of voltage (unit of mV), signal strength (unit of dBm) and charge amount (unit of pC).

The reference value may be set previously as the voltage, the signal strength or the charge amount, and is a minimum value that can be regarded as partial discharge. Also, the reference value may be set when a manufacturer of the diagnostic apparatus for a switchgear according to the present invention manufactures the diagnostic apparatus, or may be configured to enable change setup by means of a user.

In step S8, the diagnosis unit 30-1 determines whether the value of the acquired data transmitted from the data acquisition unit 20, that is, the acquired data value for the VHF electromagnetic wave signal is greater than the predetermined reference value, so as to identify the data of the electromagnetic wave signal having a value greater than noise as the partial discharge signal because the VHF band has much noise. Here, there are less noise in the UHF band, so it is easy to identify the partial discharge signal in the UHF band.

If it is determined that VHF partial discharge does not occur in the electric gear in step S7, or if the value of the acquired data transmitted from the data acquisition unit 20 is the same as or smaller than the predetermined reference value in step S8, the diagnosis unit 30-1 advances to step S9 and determines that noise (disturbance) may be mixed and displays the need of checking on the display screen of the display means included therein in the form of message or displays the need of checking by including it in a report for the diagnosis result.

Meanwhile, if the diagnosis unit 30-1 determines that the pattern indicated by corresponding data is not the pattern of the partial discharge signal in step S2, the diagnosis unit 30-1 advances to step S3-1 and senses data having a value greater than the predetermined reference value (in this case, the corresponding reference value may be set to a value the same as or different from the predetermined reference value in the step S8.)

Afterwards, the diagnosis unit 30-1 advances to step S4-1 and checks a trend of the magnitude and occurrence times of the electromagnetic wave signal indicated by the data sensed (the data transmitted from the data acquisition unit 20) for a predetermined time period set by the user.

Afterwards, the diagnosis unit 30-1 advances to step S5-1 and determines whether occurrence times is an increasing trend.

If occurrence times is not an increasing trend in step S5-1, that is, if occurrence times is a maintaining trend or decreasing trend, the diagnosis unit 30-1 advances to step S7-1 and determines that the acquired electromagnetic wave signal according to the above data is simply noise not the partial discharge signal (in other words, determines that disturbance occurs) or determines that a state of the electric gear of the diagnosis target is good.

If occurrence times is an increasing trend in step S5-1, the diagnosis unit 30-1 advances to step S6-1.

In step S6-1, when occurrence times is an increasing trend, the diagnosis unit 30-1 determines whether the electromagnetic wave signal according to the above data occurs in the UHF band only, both of the UHF band and the VHF band, or the VHF band only.

If the diagnosis unit 30-1 determines that both the electromagnetic wave signal of the UHF band and the electromagnetic wave signal of the VHF band occur in step S6-1, since the electromagnetic wave signal is not the partial discharge signal when considering the characteristic of the partial discharge signal occurring only in any one of the UHF band and the VHF band, the diagnosis unit 30-1 advances to step S7-1 and determines that the acquired electromagnetic wave signal according to the above data is simply noise not the partial discharge signal (in other words, determines that disturbance occurs) or determines that a state of the electric gear of the diagnosis target is good.

If the diagnosis unit 30-1 determines that the electromagnetic wave signal according to the above data occurs in the UHF band only or the VHF band only, the diagnosis unit 30-1 advances to step S6 and analyzes (executes a process of analysis) environment influence of temperature and humidity.

A method (process) of analyzing environment influence of temperature and humidity through the diagnosis unit 30-1 will be described with reference to FIG. 6.

First of all, in step S21, the user may set time or period for analyzing environment influence of temperature and humidity, that is, time or period from analysis start time to analysis end time in accordance with a screen displayed through the display means by means of a diagnosis program through an interface unit (for example, input means such as keyboard, mouse, and touch pad) included in the diagnosis unit 30-1, and stores data of the set time or period for analyzing environment influence of temperature and humidity into the memory included in the diagnosis unit 30-1.

Next, the diagnosis unit 30-1 advances to an environment influence analyzing step S22 for analyzing environment influence of temperature and humidity.

The environment influence analyzing step S22 includes steps S23 to S29.

First of all, in step S23, the diagnosis unit 30-1 determine whether temperature, humidity and occurrence times of the partial discharge signal or the electromagnetic wave signal of a reference value or more are all in an increasing trend, on the basis of the acquired data transmitted from the data acquisition unit 20.

In this case, temperature and humidity can be recognized by the diagnosis unit 30-1 through temperature data and humidity data included in the acquired data transmitted from the data acquisition unit 20.

Occurrence times of the partial discharge signal can be recognized in such a manner that the diagnosis unit 30-1 counts occurrence times through the step S3.

Also, occurrence times of the electromagnetic wave signal of the reference value or more may be recognized in such a manner that the diagnosis unit 30-1 counts occurrence times through the steps S3-1 and S4-1.

The diagnosis unit 30-1 may determine whether temperature, humidity and occurrence times of the partial discharge signal/the electromagnetic wave signal of a reference value or more are all in an increasing trend, by comparing start time data of the set analysis time period, the acquired data of an intermediate time, and data of the end time.

In step S23, if temperature, humidity and occurrence times of the partial discharge signal/the electromagnetic wave signal of a reference value or more are all in an increasing trend, the diagnosis unit 30-1 advances to step S24 and diagnoses occurrence of partial discharge due to (coming from) temperature and humidity.

In step S23, if temperature, humidity and occurrence times of the partial discharge signal/the electromagnetic wave signal of a reference value or more are not in an increasing trend, the diagnosis unit 30-1 advances to step S25 and determines whether temperature and occurrence times of the partial discharge signal or the electromagnetic wave signal of a reference value or more are in an increasing trend.

In step S25, if temperature and occurrence times of the partial discharge signal or the electromagnetic wave signal of a reference value or more are in an increasing trend, the diagnosis unit 30-1 advances to step S26 and diagnoses that partial discharge occurs due to temperature.

In step S25, if temperature and occurrence times of the partial discharge signal or the electromagnetic wave signal of a reference value or more are not in an increasing trend, the diagnosis unit 30-1 advances to step S27 and determines whether humidity and occurrence times of the partial discharge signal or the electromagnetic wave signal of a reference value or more are in an increasing trend.

In step S27, if humidity and occurrence times of the partial discharge signal or the electromagnetic wave signal of a reference value or more are in an increasing trend, the diagnosis unit 30-1 advances to step S28 and diagnoses that partial discharge occurs due to humidity.

As described above, if occurrence of partial discharge is diagnosed as partial discharge caused by temperature increase or humidity increase not partial discharge caused by deterioration of the electric gear, it may be required to actuate a heating means (for example, heater) to remove humidity inside the electric gear or actuate a cooling fan for temperature cooling.

In step S27, if humidity and occurrence times of the partial discharge signal or the electromagnetic wave signal of a reference value or more are not in an increasing trend, the diagnosis unit 30-1 advances to step S29 and diagnoses that partial discharge occurs due to deterioration of the electric gear.

After the step S29, the diagnosis unit 30-1 advances to steps S6a, S6b, and S6c as seen with reference to FIG. 4 or FIG. 5.

That is, if the diagnosis unit 30-1 diagnoses that partial discharge occurs due to deterioration only of the electric gear, the diagnosis unit 30-1 compares magnitude data (for example, average voltage value data of the electromagnetic wave signal) of the partial discharge signal and occurrence times data of the partial discharge signal with a predetermined warning reference value, a predetermined caution reference value and a predetermined danger reference value, determines that the partial discharge state of the electric gear of the current diagnosis target is a warning state, a caution state, or a danger state, and warns the corresponding state.

In this case, the warning state may mean the state that action for transmitting partial discharge history and trend data to a manufacturer of the corresponding electric gear and requesting accurate analysis is required when the same defect (defect due to partial discharge cause of protrusion, void, floating, and surface electric leakage) is generated again within seven days.

The caution state may mean the state that action for transmitting partial discharge history and trend data to a manufacturer of the corresponding electric gear and requesting accurate analysis is required when the same defect is generated again within three days.

The danger state may mean the state that action for transmitting partial discharge history and trend data to a manufacturer of the corresponding electric gear and requesting accurate analysis is required when the same defect is generated again within a single day.

A warning method may be performed through a diagnosis result display screen of the display included in the diagnosis unit 30-1 or by being stated in action requirements included in the aforementioned "partial discharge diagnosis report".

In step S6a, the diagnosis unit 30-1 determines whether magnitude data (for example, average voltage value data of the electromagnetic wave signal) of the partial discharge signal is greater than or the same as the predetermined warning reference value and smaller than the predetermined caution reference value, and determines whether the occurrence times data of the partial discharge signal is greater than or the same as a predetermined number warning reference value and smaller than a predetermined number caution reference value.

If the determined result of the step S6a is "yes", the diagnosis unit 30-1 determines that the state of the electric gear of the diagnosis target is the warning state and advances to the step S7a to warn the aforementioned warning state through the diagnosis result display screen of the display included therein or by stating the warning state in the action requirements of the aforementioned "partial discharge diagnosis report".

If the determined result of the step S6a is "no", the diagnosis unit 30-1 advances to step S6b.

That is, in step S6b, the diagnosis unit 30-1 determines whether magnitude data (for example, average voltage value data of the electromagnetic wave signal) of the partial discharge signal is greater than or the same as the predetermined caution reference value and smaller than the predetermined danger reference value, and determines whether the occurrence times data of the partial discharge signal is greater than or the same as the predetermined number caution reference value and smaller than a predetermined number danger reference value.

If the determined result of the step S6b is "yes", the diagnosis unit 30-1 determines that the state of the electric gear of the diagnosis target is a caution state and advances to the step S7b to warn the aforementioned caution state through the diagnosis result display screen of the display included therein or by stating the caution state in the action requirements of the aforementioned "partial discharge diagnosis report".

If the determined result of the step S6b is "no", the diagnosis unit 30-1 advances to step S6c.

That is, in step S6c, the diagnosis unit 30-1 determines whether magnitude data (for example, average voltage value data of the electromagnetic wave signal) of the partial discharge signal is greater than the predetermined danger reference value, and determines whether the occurrence times data of the partial discharge signal is greater than the predetermined number danger reference value.

If the determined result of the step S6c is "yes", the diagnosis unit 30-1 determines that the state of the electric gear of the diagnosis target is a danger state and advances to the step S7c to warn the aforementioned danger state through the diagnosis result display screen of the display included therein or by stating the danger state in the action requirements of the aforementioned "partial discharge diagnosis report".

Next, a diagnosing method will be described with reference to FIG. 5.

FIG. 5 is a detailed flow chart illustrating a procedure of analyzing the probability that a partial discharge pattern is a VHF partial discharge pattern or a UHF partial discharge pattern on the basis of a partial discharge analysis result and determining a type of partial discharge according to a cause by reflecting a weight value in a diagnostic apparatus for a switchgear according to the preferred embodiment of the present invention.

First of all, in step S11, the diagnosis unit 30-1 reads out (input of analysis result) the partial discharge pattern analysis result such as determined data of a defect type per cause of partial discharge stored in the memory in the step S4, data value (magnitude value of partial discharge signal) and occurrence times data.

In next step S12, the diagnosis unit 30-1 determines whether the probability of the UHF partial discharge signal pattern is higher than the predetermined reference probability on the basis of the partial discharge pattern analysis result.

In this case, if the identification data provided by the data acquisition unit 20 indicates the UHF band signal and the pattern indicated by the acquired data is similar to any one of pattern characteristics for the above-described four causes, the diagnosis unit 30-1 can determine that the probability of the UHF partial discharge signal pattern is 80%, for example.

Also, the predetermined reference probability may be set to 70%, for example.

Therefore, the diagnosis unit 30-1 determines that the probability (80%) of the UHF partial discharge signal pattern is higher than the predetermined reference probability (70%).

However, if the identification data provided by the data acquisition unit 20 indicates the VHF band signal, the diagnosis unit 30-1 may determine that the probability of the UHF partial discharge signal pattern is 0% without analyzing the characteristic of the pattern indicated by the acquired data.

Therefore, the diagnosis unit 30-1 determines that the probability (0%) of the UHF partial discharge signal pattern is lower than the predetermined reference probability (70%).

In step S12, if the diagnosis unit 30-1 determines that the probability of the UHF partial discharge signal pattern is higher than the predetermined reference probability, the diagnosis unit 30-1 determines a percentage of similarity for the pattern characteristics for the above-described four causes and derives a weight value which will be reflected in any one of the pattern characteristics for the four causes, which has high similarity (high similarity percentage) after advancing to step S17.

That is, among the pattern characteristics for the four causes of the partial discharge signal pattern according to the acquired data, if similarity of the protrusion pattern characteristic is 60%, similarity of the void pattern characteristic is 20%, similarity of the floating pattern characteristic is 15% and similarity of the surface electric leakage is 5%, a difference ratio, that is, 15%, between the probability (for example, 95%) of final report previously set to the protrusion pattern characteristic of the highest similarity and the probability (80%) of the UHF partial discharge signal pattern is derived as the weight value.

Therefore, the probability of partial discharge caused by protrusion cause becomes 95% obtained by adding the weight value of 15% to the probability (80%) of the UHF partial discharge signal pattern.

Afterwards, in step S18, the diagnosis unit 30-1 outputs the diagnosis result as the probability of 95% of partial discharge caused by the protrusion cause.

The corresponding analysis result can be output by being reflected in data of probability percentage per defect type (protrusion, void, floating and surface electric leakage) for each partial discharge cause of the "partial discharge diagnosis report".

If the identification data provided by the data acquisition unit 20 indicates the VHF band signal, the diagnosis unit 30-1 may determine that the probability of the UHF partial discharge signal pattern is 0% without analyzing the characteristic of the pattern indicated by the acquired data. At this time, the diagnosis unit 30-1 advances to step S13.

In step S13, the diagnosis unit 30-1 determines whether the probability of the VHF partial discharge signal pattern is higher than the predetermined reference probability on the basis of the partial discharge pattern analysis result.

In this case, if the identification data provided by the data acquisition unit 20 indicates the VHF band signal and the pattern indicated by the acquired data is similar to any one of pattern characteristics for the above-described four causes, the diagnosis unit 30-1 may determine that the probability of the VHF partial discharge signal pattern is 80%, for example.

Also, the predetermined reference probability may be set to 70%, for example.

Therefore, the diagnosis unit 30-1 determines that the probability (80%) of the VHF partial discharge signal pattern is higher than the predetermined reference probability (70%).

In step S13, if the diagnosis unit 30-1 determines that the probability of the VHF partial discharge signal pattern is higher than the predetermined reference probability, the diagnosis unit 30-1 advances to step S14.

In step S14, the diagnosis unit 30-1 analyzes a variation of a magnitude value of the VHF partial discharge signal according to data received for an analysis time period set by a user and derives the analyzed result.

That is, the diagnosis unit 30-1 compares whether the magnitude value of the VHF partial discharge signal according to the received data is greater than the predetermined reference value, and compares occurrence times (frequency) of the magnitude value of the VHF partial discharge signal, which is greater than the predetermined reference value, with predetermined reference times or determines whether the magnitude value of the VHF partial discharge signal according to the received data is in an increasing trend.

Afterwards, in step S15, the diagnosis unit 30-1 determines whether the magnitude value of the VHF partial discharge signal according to the received data is greater than the predetermined reference value, and determines whether the occurrence times (frequency) of the magnitude value of the VHF partial discharge signal, which is greater than the predetermined reference value, is greater than the predetermined reference times or the magnitude value of the VHF partial discharge signal according to the received data is in an increasing trend.

If the determined result of the step S15 is "no", the diagnosis unit 30-1 advances to step S16, and determines that the possibility of disturbance (noise) is high and diagnoses the need of checking.

If the determined result of the step S15 is "yes", the diagnosis unit 30-1 may perform the operations of step S19 and step S6 in parallel.

That is, in step S19, the diagnosis unit 30-1 determines a percentage of similarity of the pattern characteristics for the above-described four causes and derives a weight value which will be reflected in any one of the pattern characteristics for the four causes of high similarity (high similarity percentage).

That is, among the pattern characteristics for the four causes of the partial discharge signal pattern according to the acquired data, if similarity of the protrusion pattern characteristic is 5%, similarity of the void pattern characteristic is 10%, similarity of the floating pattern characteristic is 70% and similarity of the surface electric leakage is 15%, a difference ratio, that is, 15%, between the probability (for example, 95%) of final report previously set to the floating pattern characteristic of the highest similarity and the probability (80%) of the VHF partial discharge signal pattern is derived as the weight value.

Therefore, the probability of partial discharge caused by floating cause becomes 95% obtained by adding the weight value of 15% to the probability (80%) of the VHF partial discharge signal pattern.

Afterwards, the diagnosis unit 30-1 outputs the diagnosis result as the probability of 95% of partial discharge caused by the floating cause.

The corresponding analysis result may be output by being reflected in data of probability percentage per defect type (protrusion, void, floating and surface electric leakage) for each partial discharge cause of the "partial discharge diagnosis report".

Since the operation of environment influence determined in step S6 and the operation after the step S6 have been described with reference to FIG. 6, their repeated description will be omitted.

The technical effects of the diagnostic apparatus for a switchgear according to the present invention will be described as follows.

As described above, since the diagnostic apparatus for a switchgear according to the present invention is configured to acquire the electromagnetic wave signals detected by the VHF sensor and the UHF sensor and perform analysis on the basis of the data of the acquired electromagnetic wave signals, even though the partial discharge signal is generated from any one of the VHF band and the UHF band, the reliable diagnostic apparatus that may diagnose occurrence of error of the switchgear without failure may be provided, and influence of temperature and humidity may be considered.

In the diagnostic apparatus for a switchgear according to the present invention, since the data acquisition unit is configured to perform a phase synchronization process for phase synchronizing the acquired electromagnetic wave signal with a normal electric signal, distribution characteristic of a phase angle for generating the electromagnetic wave signal may be analyzed. Since the diagnosis unit is configured to determine a partial discharge cause in accordance with similarity of the partial discharge signal with respect to the distribution characteristic per type of the partial discharge cause on the basis of the distribution characteristic of data of the partial discharge signal, which is concentrated on a specific phase angle, occurrence of the partial discharge may be determined exactly and the cause type of the occurrence of the partial discharge may be determined exactly.

In the diagnostic apparatus for a switchgear according to the present invention, since the diagnosis unit is configured to check whether the magnitude of the acquired electromagnetic wave signal is a predetermined reference value or more for a predetermined time period and a trend of occurrence times when the data provided by the data acquisition unit is not a pattern of the partial discharge signal, the diagnosis unit may determine whether the partial discharge signal is generated by environment factor not deterioration of the switchgear in accordance with a trend of temperature and humidity if the magnitude of the acquired electromagnetic wave signal is the predetermined reference value or more and occurrence times of the partial discharge signal is in an increasing trend, and may determine that normal noise not partial discharge occurs or the switchgear is in a normal state if the magnitude of the partial discharge signal is the predetermined reference value or more and the occurrence times of the partial discharge signal is in a stagnant or decreasing trend.

In the diagnostic apparatus for a switchgear according to the present invention, when the occurrence times in an increasing trend, the diagnosis unit is configured to determine whether the acquired electromagnetic wave signal is generated in the UHF band only, both the UHF band and the VHF band, or the VHF band only. Therefore, the diagnosis unit can determine that the electromagnetic wave signal is a simple noise signal or the switchgear is a normal state when the electromagnetic wave signal is generated in both the VHF and the UHF band. Also, the diagnosis unit can determine whether the electromagnetic wave signal is generated by environment factor (temperature increase or humidity increase) not deterioration of the switchgear in accordance with a trend of temperature and humidity when the electromagnetic wave signal is generated in any one of the VHF band and the UHF band.

In the diagnostic apparatus for a switchgear according to the present invention, since the diagnosis unit is configured to determine whether the probability that the pattern of the acquired electromagnetic wave signal is the partial discharge signal pattern of the VHF band is higher than the predetermined reference value on the basis of the analyzed result, the diagnosis unit can determine the partial discharge cause in accordance with the characteristic of the partial discharge pattern if the probability of the partial discharge pattern of the VHF band is higher than the predetermined reference value. Also, the diagnosis unit can determine the probability that the pattern of the acquired electromagnetic wave signal is the partial discharge pattern of the UHF band if the probability of the partial discharge pattern is not higher than the predetermined reference value.

In the diagnostic apparatus for a switchgear according to the present invention, the diagnosis unit is configured to determine whether the probability that the pattern of the electromagnetic wave signal is the partial discharge signal pattern of the UHF band is higher than the predetermined reference value when the probability that the pattern of the acquired electromagnetic wave signal is the partial discharge signal pattern of the VHF band is lower than the predetermined reference value. Therefore, the diagnosis unit can analyze the partial discharge cause in accordance with analysis of variation trend of the UHF band partial discharge signal and the characteristic of the partial discharge pattern if the probability of the partial discharge pattern of the UHF band is higher than the predetermined reference value, determine whether the partial discharge signal is generated by environment factor (temperature increase or humidity increase) not deterioration of the switchgear in accordance with a trend of temperature and humidity, and determine that the partial discharge signal is a simple noise signal or the switchgear is a normal state when the probability of the partial discharge pattern of the UHF band is lower than the predetermined reference value.

In the diagnostic apparatus for a switchgear according to the present invention, if a type of the partial discharge cause is determined, the diagnosis unit is configured to add a weight value to the probability of occurrence of the determined type of partial discharge, whereby the probability of occurrence of the determined type of partial discharge can be highlighted to a user.

The diagnostic apparatus for a switchgear according to the present invention further includes a temperature sensor detecting a temperature of a switchgear of a diagnosis target, and a humidity sensor detecting humidity of the switchgear of the diagnosis target. The data acquisition unit is configured to provide temperature data and humidity data detected by the temperature sensor and the humidity sensor to the diagnosis unit, and the diagnosis unit is configured to diagnose the cause of the partial discharge on the basis of an increasing trend of temperature, humidity and occurrence times of the partial discharge signal for a time period which is preset. Therefore, the diagnostic apparatus can respectively diagnose occurrence of partial discharge caused by environment factor of temperature and humidity and occurrence of partial discharge caused by deterioration of the switchgear of the diagnosis target irrespective of temperature and humidity.

What is claimed is:

1. A diagnostic apparatus for a switchgear, comprising:
a Very High Frequency (VHF) sensor that detects an electromagnetic wave signal of a VHF band, which is generated by the switchgear of a diagnosis target;
an Ultra High Frequency (UHF) sensor that detects an electromagnetic wave signal of a UHF band, which is generated by the switchgear of the diagnosis target;
a data acquisition unit that acquires the electromagnetic wave signals detected by the VHF sensor and the UHF sensor, and converts the electromagnetic wave signals into a data indicating magnitudes of the electromagnetic wave signals; and
a diagnosis unit connected with the data acquisition unit by communication and that executes analysis including determining a partial discharge signal based on at least whether the data provided by the data acquisition unit is a pattern of a partial discharge signal and stores the analyzed result,
wherein the data acquisition unit is configured to execute a phase synchronization process for phase-synchronizing the electromagnetic wave signals with a normal electric power signal, and
wherein, the diagnosis unit is configured to:
determine a probable type of a partial discharge cause based on the similarity between the pattern of a partial discharge signal with respect to a distribution characteristic for each of a plurality of types of a partial discharge cause based on the distribution characteristic of the data, which is concentrated on a specific phase angle, and
determine whether the electromagnetic wave signals are the pattern of a partial discharge signal.

2. The diagnostic apparatus for a switchgear of claim 1, wherein the diagnosis unit is configured to check whether a magnitude of the electromagnetic wave signal is a predetermined reference value or more for a predetermined time period and a trend of occurrence times of the predetermined reference value or more when the pattern represented by the data provided from the data acquisition unit is not a pattern of a partial discharge signal.

3. The diagnostic apparatus for a switchgear of claim 2, wherein the diagnosis unit is configured to determine whether the electromagnetic wave signal is generated in the UHF band only, both the UHF band and the VHF band, or the VHF band only.

4. The diagnostic apparatus for a switchgear of claim 1, wherein the diagnosis unit is configured to determine whether the probability that the pattern of the electromagnetic wave signal is a partial discharge signal pattern of the VHF band is higher than the predetermined reference value on the basis of the analyzed result.

5. The diagnostic apparatus for a switchgear of claim 4, wherein the diagnosis unit is configured to determine whether the probability that the pattern of the electromagnetic wave signal is a partial discharge pattern of the UHF band is higher than the predetermined reference value when the probability that the pattern of the electromagnetic wave signal is the partial discharge pattern of the VHF band is not lower than the predetermined reference value.

6. The diagnostic apparatus for a switchgear of claim 1, wherein, if the probable type of a partial discharge cause is determined, the diagnosis unit is configured to add a weight value to the probability of the determined probable type of a partial discharge cause.

7. The diagnostic apparatus for a switchgear of claim 1, further comprising:
a temperature sensor that detects a temperature of the switchgear of the diagnosis target; and
a humidity sensor that detects humidity of the switchgear of the diagnosis target,
wherein the data acquisition unit is configured to provide a temperature data and a humidity data detected by the temperature sensor and the humidity sensor to the diagnosis unit, and
the diagnosis unit is configured to diagnose the partial discharge as caused by temperature and humidity increase, diagnose the partial discharge as caused by temperature increase, diagnose the partial discharge as caused by humidity increase, or diagnose the partial discharge as caused by a cause irrespective of temperature and humidity, on the basis of an increasing trend of temperature, humidity and occurrence times of the partial discharge signal for a time period which is preset.

* * * * *